(12) United States Patent
Durkee

(10) Patent No.: US 11,713,982 B2
(45) Date of Patent: Aug. 1, 2023

(54) PROXIMITY SENSOR AND METHOD OF USE

(71) Applicant: Simmonds Precision Products, Inc., Vergennes, VT (US)

(72) Inventor: Scott R. Durkee, New Haven, VT (US)

(73) Assignee: Simmonds Precision Products, Inc., Vergennes, VT (US)

(*) Notice: Subject to any disclaimer, the term of this patent is extended or adjusted under 35 U.S.C. 154(b) by 35 days.

(21) Appl. No.: 17/344,657

(22) Filed: Jun. 10, 2021

(65) Prior Publication Data
US 2021/0389161 A1 Dec. 16, 2021

Related U.S. Application Data

(60) Provisional application No. 63/037,468, filed on Jun. 10, 2020.

(51) Int. Cl.
*G01D 5/20* (2006.01)

(52) U.S. Cl.
CPC ..................... *G01D 5/20* (2013.01)

(58) Field of Classification Search
CPC ............. G01D 5/20; H03K 2217/952; H03K 17/9502; H03K 17/952
See application file for complete search history.

(56) References Cited

U.S. PATENT DOCUMENTS

| | | | |
|---|---|---|---|
| 4,950,988 A | 8/1990 | Garshelis | |
| 7,173,411 B1* | 2/2007 | Pond | H03K 17/9502 |
| | | | 324/225 |
| 7,358,720 B1 | 4/2008 | Maier | |
| 10,436,608 B2 | 10/2019 | Thoss et al. | |
| 2005/0212510 A1 | 9/2005 | Kirchdoerffer et al. | |
| 2021/0041268 A1* | 2/2021 | Shi | H03K 17/9502 |

FOREIGN PATENT DOCUMENTS

| | | | |
|---|---|---|---|
| EP | 2885610 A1 | 6/2015 | |
| WO | WO-2012055914 A1 * | 5/2012 | ......... H03K 17/9502 |

OTHER PUBLICATIONS

Extended European search report issued in corresponding application No. 21178874.0, dated Nov. 9, 2021 (10 pages).

* cited by examiner

*Primary Examiner* — Akm Zakaria
(74) *Attorney, Agent, or Firm* — Locke Lord LLP; Joshua L. Jones; Gabrielle L. Gelozin

(57) ABSTRACT

A method of measuring target proximity comprising the steps of transmitting a magnetic field signal by a controller of a proximity sensor at a target, measuring impedance of an inductor of a proximity sensor, calculating a relative position of the target in relation to a sensor face, and providing a near/far output status of the target at a predetermined rate.

13 Claims, 2 Drawing Sheets

PROXIMITY SENSOR AND METHOD OF USE

CROSS-REFERENCE TO RELATED APPLICATIONS

This application claims priority to and the benefit of U.S. Provisional Application No. 63/037,468, filed Jun. 10, 2020, the entire contents of which are herein incorporated by reference in their entirety.

BACKGROUND

Technological Field

The present disclosure relates to a proximity sensor, and more particularly to a proximity sensor configured to sense the position of a ferromagnetic target.

Description of Related Art

Proximity sensing devices are devices that produce an output based upon a distance between two or more sensors or objects. Proximity sensors typically contain electrical circuits having an electrical, mechanical, or optical distance sensing portion. Electromechanical sensors are often used to establish contact between two objects, such as an end switch, and electrical sensors are frequently used when a distance measurement is desired. Electrical proximity sensors commonly include inductance sensors, which rely on unique electrical properties of inductance circuits to detect the proximity of a target object.

Proximity sensors are prevalent in several industries, such as process management, automotive, and aviation. Their applications span a large range from traffic control to linkage actuation control. For example, proximity sensing devices are an integral and indispensable component of a modern aircraft. Knowledge that a moving surface has reached a particular location in its travel can promote proper and safe operation of various aircraft systems. A variety of proximity sensors are known, but as the needs of modern aircraft develop the sizes, weights, and speeds of the typical proximity are not enough. The conventional proximity methods and systems have generally been considered satisfactory for their intended purpose. However, there is still a need in the art for proximity sensors having improved speeds and reliability. There also remains a need in the art for such systems and components that are economically viable. The present disclosure may provide a solution for at least one of these remaining challenges.

SUMMARY OF THE INVENTION

A method of measuring target proximity includes transmitting a magnetic field signal by a controller of a proximity sensor at a target, measuring impedance of an inductor of a proximity sensor, calculating a relative position of the target in relation to a sensor face, and providing a near/far output status of the target at a predetermined rate of below 4 milliseconds.

The voltage can be measured through a reference resistor, where calculating a relative position includes a ratio of a change in DC voltage across the inductor at two distinct times and a change in DC voltage across the reference resistor. Calculating the inductance of the sensor which is then used to infer the target position can be based on the equation $R_{ref}[(V_{sensor,t1}*t2)-(V_{sensor,t2}*t1)]/(V_{ref,t2}-V_{ref,t1})$ where $R_{ref}$ is the resistance of the reference resistor, $V_{sensor,t1}$ is voltage across the inductor at a first instance, $V_{sensor,t2}$ is voltage across the inductor at a second instance, t1 is a first instance, t2 is a second instance, $V_{ref,t2}$ is a voltage across the reference resistor at a second instance, and $V_{ref,t1}$ is a voltage across the reference resistor at a first instance. The first instance of the sensor and the second instance of the inductor can be the same as the first instance of the resistor and the second instance of the resistor.

The current sent through the reference resistor can include trapezoidal amperage, wherein the current sent through the reference resistor is increased from a first instance to a second instance and decreased thereafter.

A proximity sensor configured to produce the method described above includes a sensor face, sensor electronics within the sensor face configured to transmit a magnetic field signal at a target, wherein the sensor electronics include at least one reference resistor and at least one inductor sensor, and a controller configured to control the magnetic field signal. The controller can be configured to calculate a relative position of a target using a ratio of a change in DC voltage across the inductor at two distinct times and a change in DC voltage across the reference resistor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION

Figure 1:
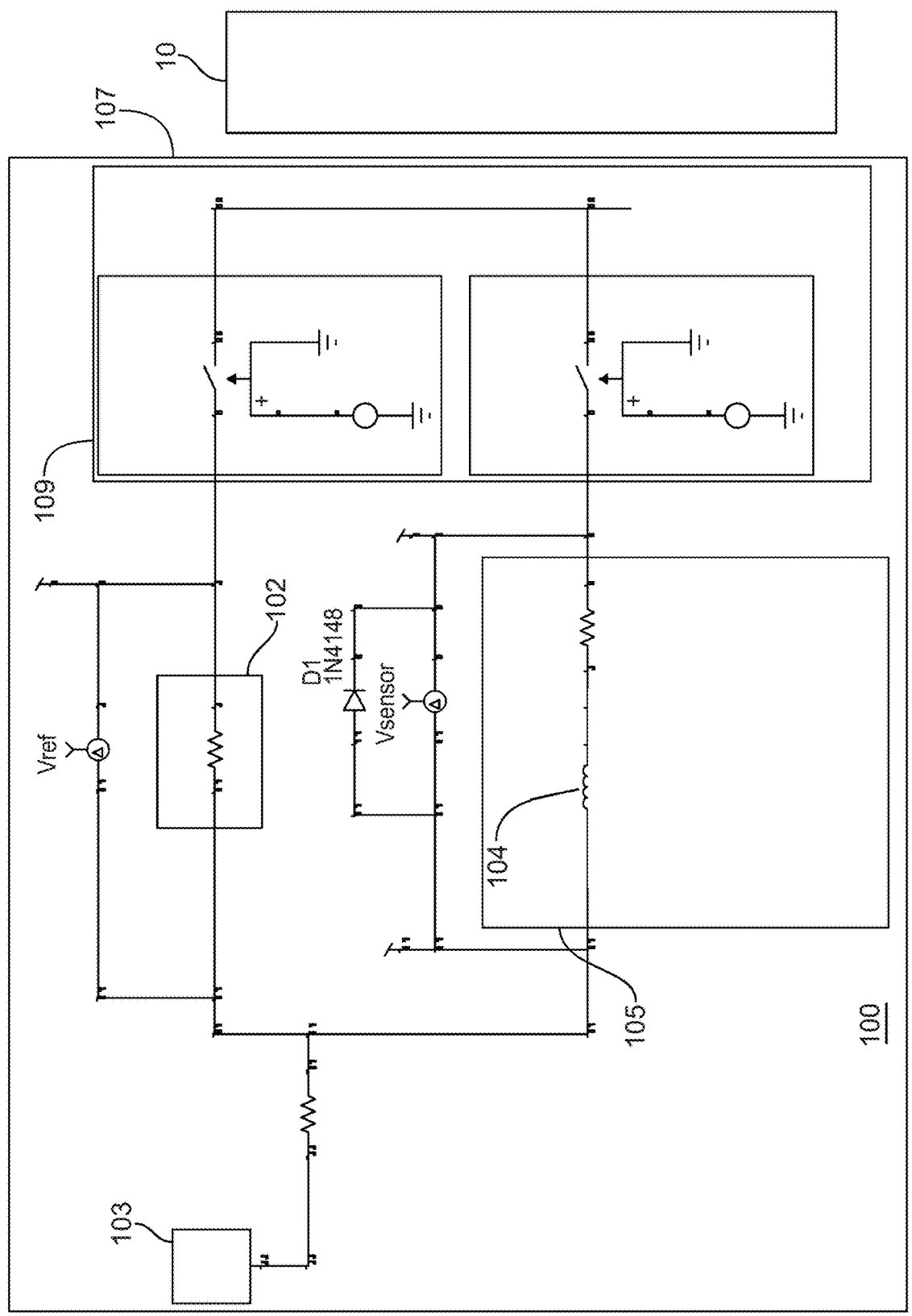
FIG. 1 is a perspective view of proximity sensor electronics.

Reference will now be made to the drawings wherein like reference numerals identify similar structural features or aspects of the subject invention. For purposes of explanation and illustration, and not limitation, a partial view of an exemplary embodiment of a proximity sensor in accordance with the invention is shown in FIG. 1 and is designated generally by reference character 100. Other embodiments of the proximity sensor 100 in accordance with the invention, or aspects thereof, are provided in FIG. 2, as will be described. The methods and systems of the invention can be used to decrease the size of typical proximity sensor and to increase reliability.

A method of measuring target 10 proximity includes transmitting a magnetic field signal by a controller 103 of a proximity sensor 100 at a target 10, measuring impedance of an inductor 104 of the proximity sensor 100, calculating a relative position of the target 10 in relation to a sensor face 107, and providing a near/far output status of the target at a predetermined rate of below 4 milliseconds. The methods described below are used to remotely sense the position of a ferromagnetic target by the utilizing the inductance measurement of a proximity sensor located in the region of the target. Measurement Electronics are co-located within the proximity sensor to eliminate the need to pass analog sensor measurements over long cable lengths.

FIG. 1 shows the electronics of a proximity sensor 100 configured to transmit a magnetic field signal at a target 10. The sensor includes at least one reference resistor 102 placed in parallel with at least one inductor sensor 105. The controller 103 is also configured to calculate a relative position of a target using a ratio of a change in DC voltage across the inductor 104 at two distinct times and a change in DC voltage across the reference resistor 102. The inductor 104 and the reference resistor 102 are toggled by the switch system 109 also located within the proximity sensor 100.

Measuring target proximity includes transmitting a current signal by the controller 103, measuring impedance of the inductor 104, calculating a relative position of the target in relation to a sensor face, and providing a near/far output status of the target at a predetermined rate. Voltage is then measured through the reference resistor 102. The reference resistor 102 is a separate precision resistor that is switched in by the switch system 109 or multiplexer and receives the same trapezoidal current that is used to drive the inductor 104. Where calculating a relative position includes a ratio of a change in DC voltage across the inductor 104 at two distinct times and a change in DC voltage across the reference resistor 102. Calculating the inductance of the sensor which is then used to infer the target position is based on the equation $Rref[(Vsensor,t1*t2)-(Vsensor,t2*t1)]/(Vref,t2-Vref,t1)$ where Rref is the resistance of the reference resistor 102, Vsensor,t1 is voltage across the inductor 104 at a first instance, Vsensor,t2 is voltage across the inductor 104 at a second instance, t1 is a first instance, t2 is a second instance, Vref,t2 is a voltage across the reference resistor 102 at a second instance, and Vref,t1 is a voltage across the reference resistor 102 at a first instance. The first instance of the sensor and the second instance of the inductor 104 can be the same as the first instance of the resistor 102 and the second instance of the resistor 102.

Figure 2:
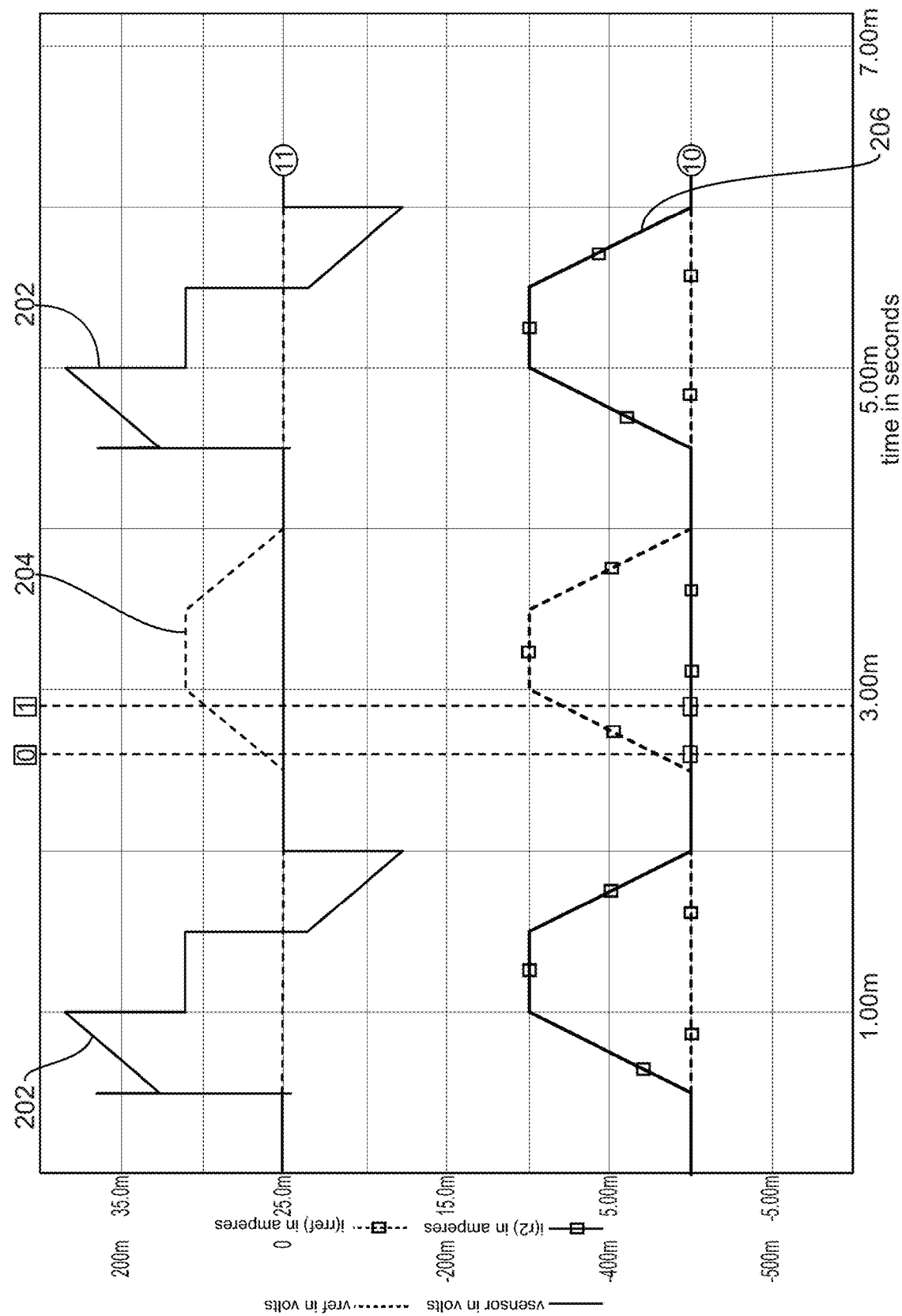
FIG. 2 is a graphical view of a signal pattern sent through the electronics of FIG. 1, showing the trapezoidal signal pattern.

The current sent through the reference resistor 102 includes trapezoidal amperage as shown in FIG. 2, wherein the current sent through the reference resistor 102 is increased from a first instance to a second instance and decreased thereafter. The trapezoidal current allows the signal conditioning to eliminate the series resistance term in the inductor 104 and obtain only the inductive portion which is the desired term since it is proportional to the target distance. The first trapezoidal waveform 202 in the figure is the voltage across the inductor 104 when the trapezoidal drive current is sent through it. The second trapezoidal waveform 204 is the voltage across the reference resistor 102 when the trapezoidal current is switched to be sent therethrough. The bottom graph 206 shows the drive current waveform which is the same for both the inductor 104 and the reference resistor 102.

The methods and systems of the present disclosure, as described above and shown in the drawings, provide for proximity sensor with superior properties including increased reliability and stability, and reduced size, weight, complexity, and/or cost. While the apparatus and methods of the subject disclosure have been showing and described with reference to embodiments, those skilled in the art will readily appreciate that changes and/or modifications may be made thereto without departing from the spirit and score of the subject disclosure.

What is claimed is:

1. A method of remotely measuring a position of a target comprising the steps of:

transmitting, with a controller of a proximity sensor, a magnetic field signal at the target;

measuring impedance of an inductor of the proximity sensor;

calculating a relative position of the target in relation to a face of the proximity sensor; and providing a near/far output status of the target at a predetermined rate, wherein calculating a relative position is based on the equation $Rref[(Vsensor,t1*t2)-(Vsensor,t2*t1)]/(Vref,t2-Vref,t1)$ where Rref is a resistance of a reference resistor, Vsensor,t1 is voltage across the inductor at a first instance, Vsensor,t2 is voltage across the inductor at a second instance, t1 is a first instance, t2 is a second instance, Vref,t2 is a voltage across the reference resistor at a second instance, and Vref,t1 is a voltage across the reference resistor at a first instance.

2. The method of claim 1, further comprising measuring voltage across a reference resistor.

3. The method of claim 2, wherein calculating a relative position includes a ratio of a change in DC voltage across the inductor at two distinct times and a change in DC voltage across the reference resistor.

4. The method of claim 1, wherein the first instance of the inductor and the second instance of the inductor are the same as the first instance of the resistor and the second instance of the resistor.

5. The method of claim 1, wherein the predetermined time period is below 4 milliseconds.

6. The method of claim 1, wherein a current sent through the reference resistor is trapezoidal amperage.

7. The method of claim 6, wherein the current sent through the reference resistor is increased from the first instance to the second instance.

8. A proximity sensor comprising:

a sensor face;

sensor electronics within the sensor face configured to transmit a magnetic field signal at a target, wherein the sensor electronics include at least one reference resistor and at least one inductor sensor operatively connected in parallel; and a controller configured to control the magnetic field signal, wherein calculating a relative position is based on the equation $Rref[(Vsensor,t1*t2)-(Vsensor,t2*t1)]/(Vref,t2-Vref,t1)$ where Rref is the resistance of the reference resistor, Vsensor,t1 is voltage across the inductor at a first instance, Vsensor,t2 is voltage across the inductor at a second instance, t1 is a first instance, t2 is a second instance, Vref,t2 is a voltage across the reference resistor at a second instance, and Vref,t1 is a voltage across the reference resistor at a first instance.

9. The sensor of claim 8 wherein, the controller is configured to calculate a relative position of a target using a ratio of a change in DC voltage across the inductor at two distinct times and a change in DC voltage across the reference resistor.

10. The sensor of claim 8, wherein the first instance of the inductor and the second instance of the inductor are the same as the first instance of the resistor and the second instance of the resistor.

11. The sensor of claim 8, wherein the predetermined time period is below 4 milliseconds.

12. The sensor of claim 8, wherein a current sent through the reference resistor is trapezoidal.

13. The sensor of claim 8, wherein a current sent through the reference resistor is increased from the first instance to the second instance.

\* \* \* \* \*